(12) United States Patent
Sutton et al.

(10) Patent No.: US 8,121,668 B2
(45) Date of Patent: Feb. 21, 2012

(54) SYSTEM AND METHOD FOR PROVIDING FLOW-ENHANCED SIGNAL INTENSITY DURING A FUNCTIONAL MRI PROCESS

(75) Inventors: Bradley P. Sutton, Savoy, IL (US); Bryce L. Ching, Peoria, IL (US); Luisa Ciobanu, Le Pecg (FR)

(73) Assignee: The Board of Trustees of the University of Illinois, Urbana, IL (US)

( * ) Notice: Subject to any disclaimer, the term of this patent is extended or adjusted under 35 U.S.C. 154(b) by 777 days.

(21) Appl. No.: 12/179,994

(22) Filed: Jul. 25, 2008

(65) Prior Publication Data

US 2009/0088626 A1 Apr. 2, 2009

Related U.S. Application Data

(60) Provisional application No. 60/951,821, filed on Jul. 25, 2007.

(51) Int. Cl.
*A61B 5/055* (2006.01)
(52) U.S. Cl. .......................... 600/419; 600/407; 600/410
(58) Field of Classification Search .................. 600/407, 600/410, 419
See application file for complete search history.

(56) References Cited

U.S. PATENT DOCUMENTS

| 6,850,060 B2 | 2/2005 | Song et al. |
| 6,992,484 B2 | 1/2006 | Frank |

OTHER PUBLICATIONS

BP Sutton, et al., "Functional imaging with FENSI: Flow-enhanced signal intensity", Magnetic Resonance in Medicine, vol. 58, Jul. 24, 2007, pp. 396-401.

C Ouyang, et al., "Volumetric blood flow rate measurement by flow enhancement of signal intensity (FENSI)", Proceedings of the International Society for Magnetic Resonance in Medicine, 16th Scientific Meeting and Exhibition, Toronto, Canada, May 3-9, 2008, p. 3575.
S Olt, et al., "Microscopic spin tagging (MIST) for flow imaging", Magnetic Resonance Materials in Physics, Biology and Medicine, vol. 15, 2002, pp. 45-51.
EC Wong, et al., "Velocity-selective arterial spin labeling", Magnetic Resonance in Medicine, vol. 55, 2006, pp. 1334-1341.
PCT/US2008/071215 International Search Report mailed on Nov. 6, 2008.
Ciobanu, Luisa, Webb, Andrew G., Penington, Charles H., "Signal Enhancement by Diffusion: Experimental Observation of the "DESIRE" Effect", Journal of Magnetic Resonance, 2004, pp. 252-256, Elsevier Inc.

*Primary Examiner* — Tse Chen
*Assistant Examiner* — Mark Remaly
(74) *Attorney, Agent, or Firm* — Quarles & Brady LLP

(57) ABSTRACT

A method for imaging a brain of a subject includes providing a cognitive task for the subject or measuring resting state blood flow without a cognitive task, applying a saturation pulse sequence to saturate a slice within an imaging volume in the subject, and applying an imaging pulse sequence to acquire data from the imaging volume. A saturated image is acquired shortly after termination of the saturation pulse sequence and a non-saturation image is acquired after spins flowing through the saturated slice have recovered. The saturation image and the non-saturation image are subtracted to generate a blood velocity or perfusion enhanced difference image indicating portions of the brain active during the cognitive task. When measuring resting state blood flow without a cognitive task, the method includes acquiring a calibration scan and performing a quantitative evaluation of the blood velocity perpendicular to the saturated slice.

14 Claims, 7 Drawing Sheets

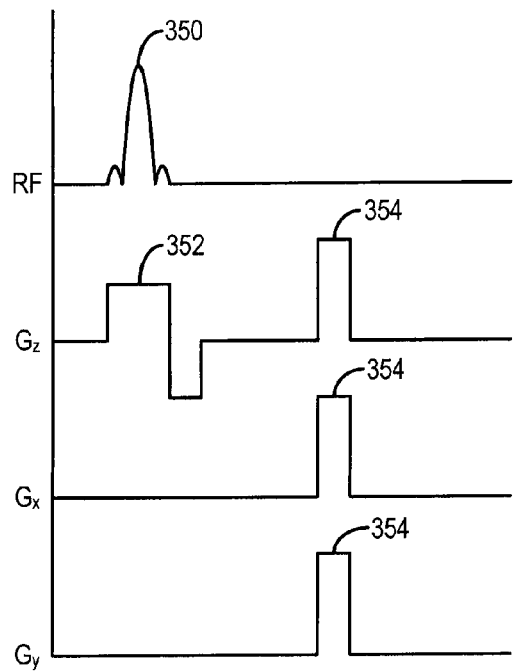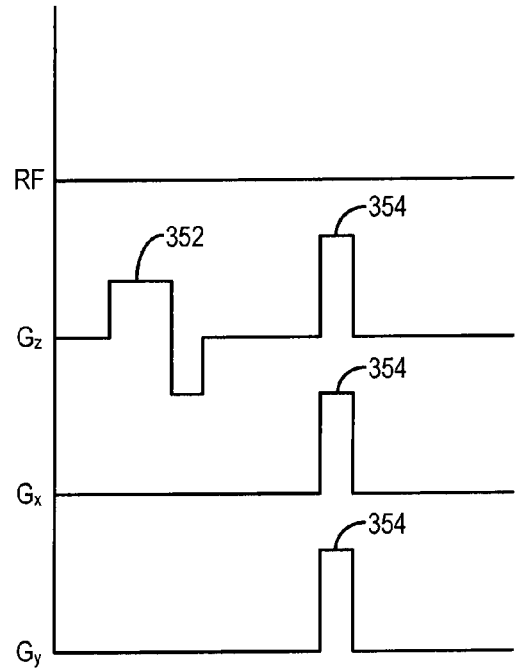
FIG. 4A    FIG. 4B
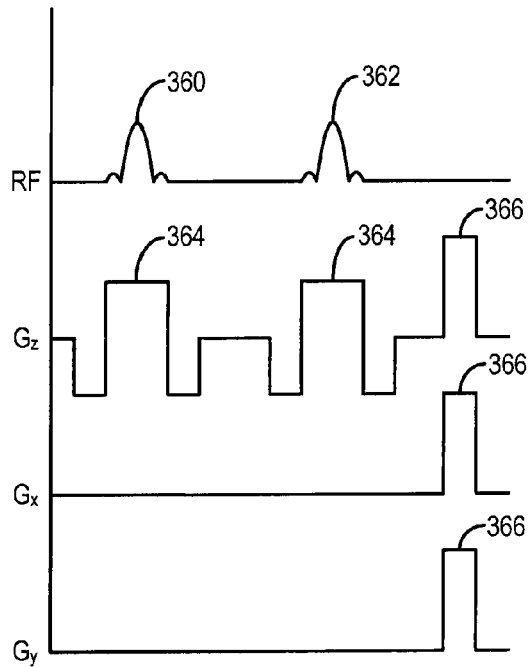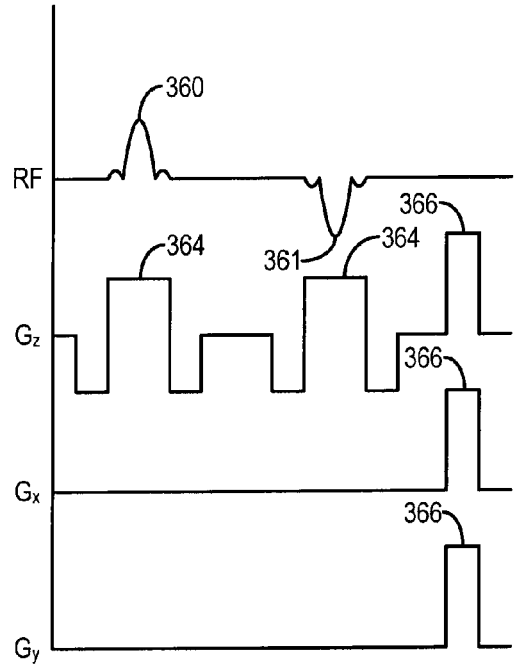
FIG. 5A    FIG. 5B

SYSTEM AND METHOD FOR PROVIDING FLOW-ENHANCED SIGNAL INTENSITY DURING A FUNCTIONAL MRI PROCESS

CROSS-REFERENCE TO RELATED APPLICATIONS

This application claims the benefit of U.S. Provisional patent application Ser. No. 60/951,821 filed on Jul. 25, 2007, and entitled "System and Method for Providing Flow-Enhanced Signal Intensity During A Functional MRI Process", which is herein incorporated by reference.

BACKGROUND OF THE INVENTION

The field of the invention is functional magnetic resonance imaging (fMRI) systems and methods. More particularly, the invention relates to employing flow-based imaging techniques that are selectively sensitive to blood flow velocities over a wide range so that a more accurate measure of neuronal activity is achieved.

When a substance such as human tissue is subjected to a uniform magnetic field (polarizing field $B_0$), the individual magnetic moments of the excited nuclei in the tissue attempt to align with this polarizing field, but process about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space as described, for example, in U.S. Pat. No. 6,954,067. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1 DFT of each radial projection view and then transforming the Radon space data set to image space by performing a filtered backprojection.

In addition to providing images of soft tissues, MR signals can be used to study neuronal activity by utilizing functional magnetic resonance imaging (fMRI) techniques. Conventional fMRI detects changes in cerebral blood volume, flow, and oxygenation that locally occur in association with increased neuronal activity induced by functional paradigms. These changes provide a mechanism for image contrast commonly referred to as the blood-oxygen level dependent (BOLD) signal contrast. As described in U.S. Pat. No. 5,603,322, an MRI system is used to acquire signals from the brain over a period of time. As the brain performs a task, these signals are modulated synchronously with task performance to reveal which regions of the brain are involved in performing the task. The series of fMRI time course images must be acquired at a rate that is high enough to see the changes in brain activity induced by the functional paradigm. In addition, because neuronal activity may occur at widely dispersed locations in the brain, a relatively large 3D volume or multi-slice volume must be acquired in each time frame.

Conventionally, fMRI methods use a signal difference technique to produce images that are indicative of neuronal activity associated with a particular functional task. In these methods, a time series of image data is first acquired with an echo-planar imaging (EPI) pulse sequence while the particular functional task is being performed by a subject. Next, a baseline image data set is acquired while the subject is at rest and no functional task is being performed. The baseline data set is subsequently subtracted from the time series of image data to produce difference images that reveal those parts of the brain that were active during the performance of the functional task.

The differences in MR signal levels attributable to the BOLD signal contrast are relatively small. Often times, these signal differences are only on the order of 2 to 4 percent (at 1.5 Tesla) in pulse sequences that employ voxel sizes in the range of 40 mm$^3$ to 50 mm$^3$. In addition, the signal differences are often masked by system noise and artifacts caused by patient motion, brain pulsatility, blood flow, and cerebral blood flow (CBF).

As an alternative to fMRI methods that rely on the BOLD signal contrast mechanism, flow-based methods have been studied. Because the image contrast mechanism for flow-based methods arises from imaging changes in blood flow that more closely correspond to the hemodynamic response resulting from the performance of a functional task. In an effort to increase image contrast attributable to the relatively small signal levels associated with the hemodynamic response, or to weight particular signals attributable to cerebral blood flow (CBF) or another measurable mechanism, various "tagging" or "labeling" methods have been developed. One such method is referred to as the arterial spin labeling (ASL) family of techniques. These techniques have been used to detect and provide a quantitative measure of neuronal activity. In conventional ASL, arterial blood is tagged by magnetic inversion or saturation proximal to a region of interest (ROI) to be imaged. That is, ASL techniques tag blood some distance away from the slice or volume of interest to be imaged. The tagged blood flows into the ROI and the inflow is detected as a modulation of the longitudinal magnetization.

To create an image of flow, most ASL methods acquire one image with tagged blood and one with untagged (control) blood and subtract the two images. The successfulness of implementing an ASL technique depends on accurately determining when the tagged blood enters and leaves the region of interest because ill-timed image acquisitions can result in severe signal loss and/or artifacts in the reconstructed image. Another tagging method, referred to as the flow-sensitive alternating inversion recovery (FAIR) technique, uses slice-selective and nonselective inversion recovery acquisitions interleaved and subtracted to give signal weighting proportional to the inflow of spins into the imaging slice.

It is at the level of the arterioles that localized control of blood flow occurs; therefore, it is desirable to image blood flow at the level not only of the arterioles, but also the capillaries and venules. Because there is a continuous change in dynamic factors (e.g. pulsatility, diameter, resistance, compliance, and age effects), the blood velocities at the arteriole, capillary, and venule levels span a wide range. For example, the average velocities for the aorta, small arteries, arterioles, capillaries, venules, small veins, and the venae cavae are approximately 33 cm/s, 4 cm/s, 2 cm/s, 0.03 cm/s, 0.3 cm/s, 1 cm/s, and 10 cm/s, respectively. Therefore, by targeting velocities in the 1-2 cm/s range, an experiment would be sensitive to arterioles and small veins. Velocity-selective ASL methods exist that allow visualization of blood when the flow slows between the tagging and acquisition phases; however, such techniques are not able to provide adequate visualization of the wide range of velocities desired for experiments targeting the CBF at the arteriole and capillary levels.

Therefore, it would be desirable to have a system and method capable of tagging blood flow to provide a localized representation of flow that is velocity selective over a wide range.

SUMMARY OF THE INVENTION

The present invention overcomes the aforementioned drawbacks by providing a system and method for generating an image indicative of functionally-induced, localized blood flow caused by a subject performing a functional task. More specifically, the present invention provides a system and method to calculate blood velocity and volumetric blood flow rate from the localized imaging voxels.

In accordance with one aspect of the invention, a method for imaging a subject is disclosed that includes repeatedly applying a tagging saturation RF pulse to saturate a localized region, such as a thin slice, within an imaging volume in the subject and applying an imaging pulse sequence to acquire data from the imaging volume. The method also includes segregating the data into a saturated data set and a non-saturated data set, reconstructing a saturated image from the saturated data set, and reconstructing a non-saturated image from the non-saturated data set. The saturated image and the non-saturated image are subtracted to generate a perfusion enhanced difference image indicating portions of the brain active during the functional task. The acquired saturated image data can be selectively sensitized to different blood flow velocities so that substantially only blood flowing at the selected velocities is saturated. In this way, the method of the present invention can provide an assessment of localized, functionally-induced blood flow at various levels within the subject's vasculature, such as, at the arteriole and capillary level. Additionally, a quantitative measurement of the volumetric flow rate of blood can be calculated from the perfusion enhanced difference image.

In accordance with another aspect of the invention, a method for imaging a subject is disclosed that includes applying a tagging saturation RF pulse to saturate a localized region within an imaging volume in the subject acquiring a first data set from the imaging volume. The method also includes acquiring a first non-saturated image data set from the imaging volume, reconstructing a calibration saturated image from the first data set, and reconstructing a calibration non-saturated image from the first non-saturated image data set. Thereafter, a tagging RF pulse is repeatedly applied to the localized region so that a second saturated image data set is subsequently acquired. Likewise, a second non-saturated image data set is acquired, and saturated and non-saturated images are reconstructed from the respective second image data sets. Thereafter, a quantitative measurement of signal enhancement is calculated from the saturated and non-saturated calibration images and from the saturated and non-saturated images. The acquired saturated image data can be selectively sensitized to different blood flow velocities so that substantially only blood flowing at the selected velocities is saturated. In this way, the method of the present invention can provide an assessment of localized, functionally-induced blood flow at various levels within the subject's vasculature, such as, at the arteriole and capillary level. Additionally, a quantitative measurement of the volumetric flow rate of blood can be calculated from the calculated signal enhancement.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 4A is a diagram of one embodiment of a "tagging" saturation module of the pulse sequence of FIG. 3;

FIG. 4B is a diagram of one embodiment of a "control" saturation module of the pulse sequence of FIG. 3;

FIG. 5A is a diagram of another embodiment of a "tagging" saturation module of the pulse sequence of FIG. 3;

FIG. 5B is a diagram of another embodiment of a "control" saturation module of the pulse sequence of FIG. 3;

DETAILED DESCRIPTION OF THE PREFERRED EMBODIMENT

Figure 1:
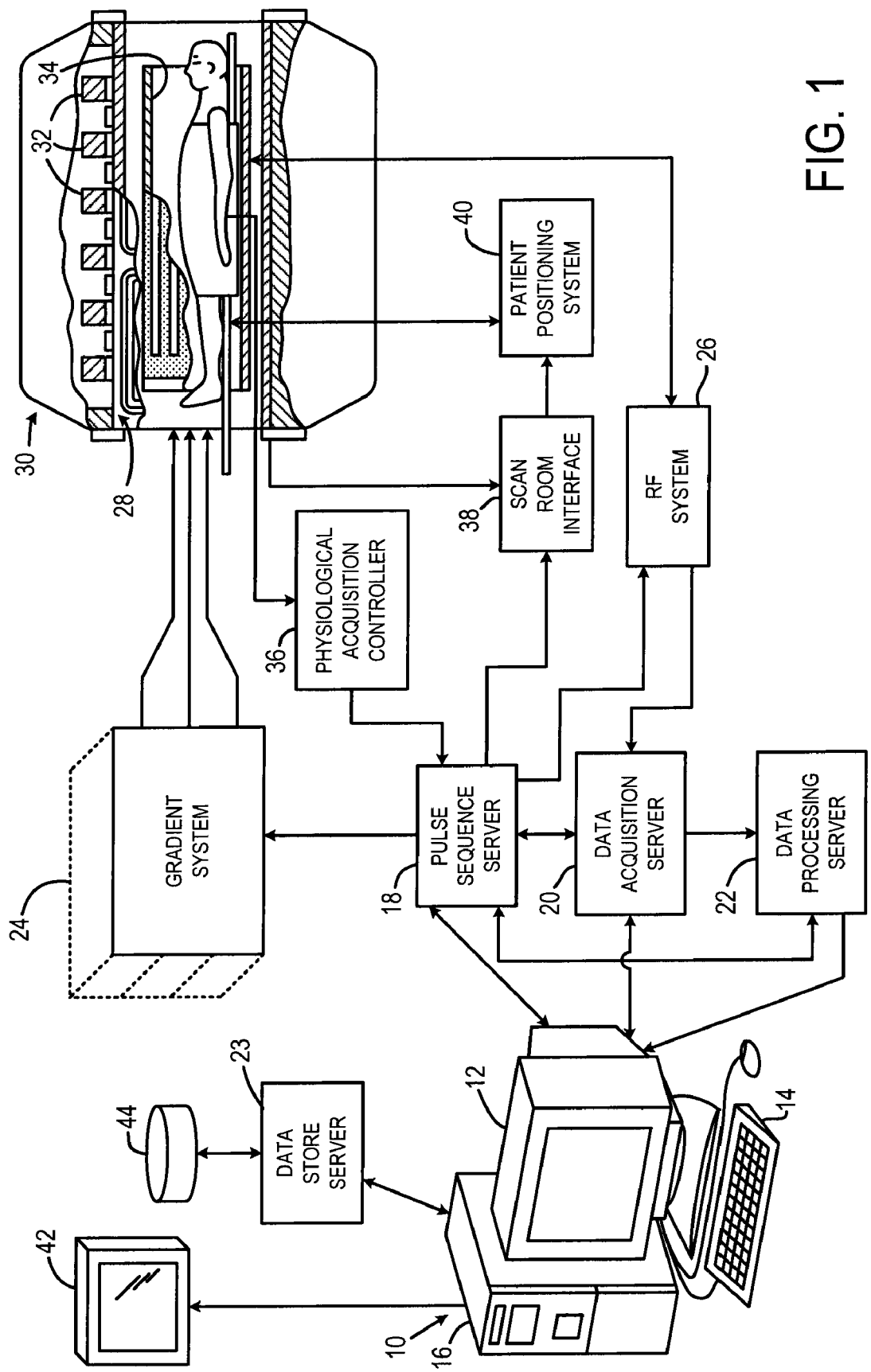
FIG. 1 is a block diagram of an MRI system for use with the present invention.

Referring particularly to FIG. 1, the preferred embodiment of the invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers: a pulse sequence server 18; a data acquisition server 20; a data processing server 22, and a data store server 23. The workstation 10 and each server 18, 20, 22, and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$, and $G_z$ used for position encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase, and pulse amplitude waveform. The generated RF pulses may be applied to the whole body RF coil 34 or to one or more local coils or coil arrays (not shown in FIG. 1).

The RF system 26 also includes one or more RF receiver channels. Each RF receiver channel includes an RF amplifier that amplifies the MR signal received by the coil to which it is connected and a detector that detects and digitizes the in-phase (I) and quadrature (Q) components of the received MR signal. The magnitude of the received MR signal may thus be determined at any sampled point by the square root of the sum of the squares of the I and Q components:

$$M = \sqrt{I^2 + Q^2},$$

and the phase of the received MR signal may also be determined:

$$\phi = \tan^{-1}\left(\frac{Q}{I}\right).$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example: Fourier transformation of raw k-space MR data to produce two or three-dimensional images; the application of filters to a reconstructed image; the performance of a backprojection image reconstruction of acquired MR data; the calculation of functional MR images; and the calculation of motion or flow images.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
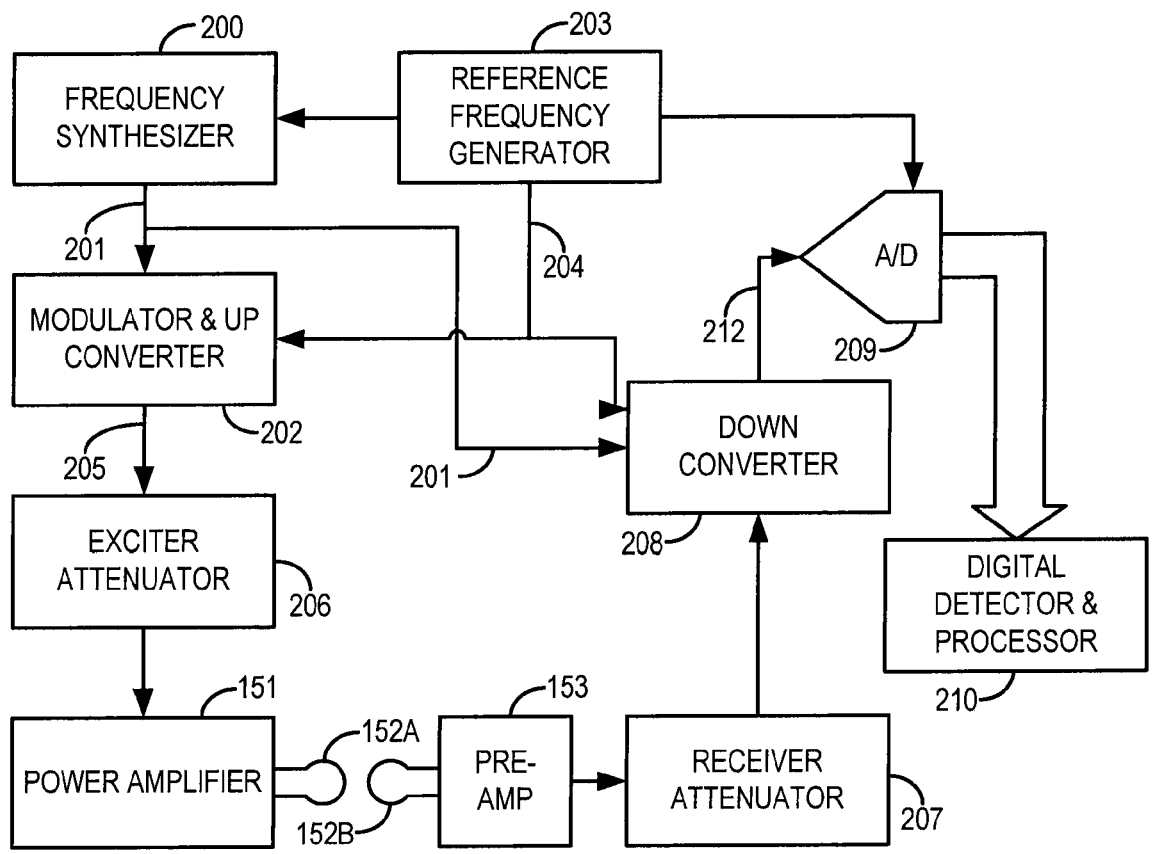
FIG. 2 is a schematic representation of a radiofrequency (RF) system for use with the MRI system of FIG. 1.

As shown in FIG. 1, the RF system 26 may be connected to the whole body RF coil 34, or as shown in FIG. 2, a transmitter section of the RF system 26 may connect to one RF coil 152A and its receiver section may connect to a separate RF receive coil 152B. Often, the transmitter section is connected to the whole body RF coil 34 and each receiver section is connected to a separate local coil 152B.

Referring particularly to FIG. 2, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal, R(t), also received from the pulse sequence server 18. The signal, R(t), defines the envelope of the RF excitation pulse to be produced and is produced by sequentially reading out a series of stored digital values. These stored digital values may, be changed to enable any desired RF pulse envelope to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A.

Referring still to FIG. 2 the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two step process by a down converter 208 that first mixes the MR signal with the carrier signal on line 201 and then mixes the resulting difference signal with a reference signal on line 204. The down converted MR signal is applied to the input of an analog-to-digital (A/D) converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 are produced by a reference frequency generator 203.

Figure 3:
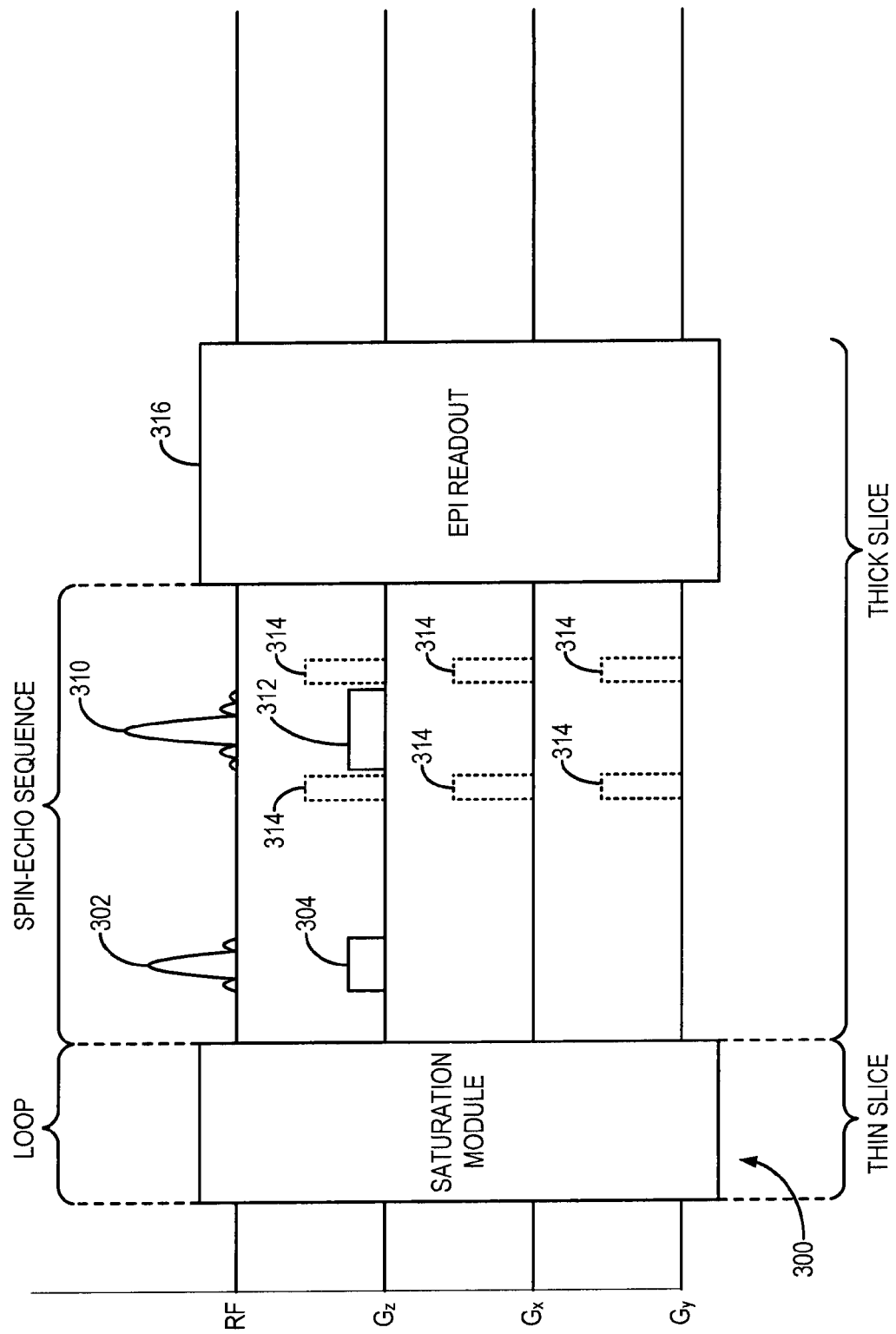
FIG. 3 is a diagram of a pulse sequence for use with the MRI system of FIG. 1.

Referring now to FIG. 3, a diagram of a pulse sequence employed when practicing the present invention is shown. This pulse sequence is adapted from a diffusion enhancement of signal and resolution (DESIRE) method with an EPI readout, such as the one described in C. H. Pennington, "Prospects for Diffusion Enhancement of Signal and Resolution in Magnetic Resonance Microscopy", Concept. Magn. Res., 2003; 19(A):71-79 and Ciobanu L, et al., "Signal Enhancement by Diffusion: Experimental Observation of the 'DESIRE' Effect", J. Magn. Reson., 2004; 170(2):252-256. The present invention builds upon the DESIRE method by employing a pulse sequence, which is very sensitive to flow, to achieve a signal intensity useful to provide a measurement of localized blood flow. The pulse sequence includes a spin-echo echo-planar imaging (SE-EPI) sequence, which is supplemented by a saturation module 300 that precedes the SE-EPI sequence. As described below, during each repetition of the pulse sequence, the saturation module 300 is either a "tagging" module or "control" module.

The SE-EPI sequence begins by generating a 90 degree RF pulse 302 in the presence of a slice selective gradient 304 to produce transverse magnetization in a slice through the subject. Subsequent to the 90 degree RF pulse, a 180 degree RF pulse 310 is played out in the presence of a slice-selective gradient 312 so that the transverse magnetization produced by the 90 degree RF pulse is refocused to form an echo signal. The 180 degree RF pulse is preferably preceded and followed by the application of flow crusher gradients 314 in each of the x-, y-, and z-axes so that slower flow velocities can be optionally selected for imaging. By varying the magnitude of the flow crusher gradients 314, the acquired image data can be selectively sensitized to different blood flow velocities. More specifically, the flow crusher gradients 314 act to substantially suppress MR signals from blood flowing at velocities above a threshold associated with the magnitude of the crusher gradients 314. In addition, the acquired data can be selectively sensitized to different blood flow velocities by adding a user selected delay time between repetitions of the tagging module such that the delay time results in the sensitization of the saturated image data to the selected velocity.

Referring now to FIG. 4A, one embodiment of a tagging module includes a 90 degree RF pulse 350 that is played out in the presence of a slice-selective gradient 352. The tagging saturation module saturates the magnetization in a slice defined by the slice-selective gradient 352, or plane positioned at a location along the slice-select axis within the imaging volume. The nominal thickness, 2a, of the saturated plane, in the absence of significant diffusion during the saturation pulse, is defined to be the full-width-half-maximum (FWHM) of the frequency-domain sinc function, given by:

$$2a = 1.21 \frac{2\pi}{\gamma G_z t_z}. \tag{1}$$

Where $\gamma$ is the gyromagnetic ratio, $G_z$ is the amplitude of the slice-selective gradient 352, and $t_z$ is the duration of the slice-selective gradient 352.

After the RF pulse 350, any remaining transverse magnetization is dephased using a spoiler gradient 354. As illustrated, the spoiler gradient pulses 354 are placed on all three axes; however, in the alternative they can be applied on only one or two of the axes. As will be described with respect to FIG. 6, when acquiring saturated imaging data, the RF pulse 350 is repeated in order to keep saturating the magnetization in the selected thin slice for a time period on the order of $T_1$. In accordance with one embodiment, the repetitions of the tagging RF pulse 350 and spoiler pulses 354 are repeated approximately every 11 ms. The tagging module is employed in conjunction with an imaging sequence so that images are reconstructed that are indicative of the saturated blood flowing into the image slice.

Referring particularly to FIG. 4B, one embodiment of a control saturation module is similar to the tagging module of FIG. 4A and includes a slice-selective gradient 352 and spoiler gradients 354; however, the control module does not include an RF pulse. The control module is employed in conjunction with an imaging sequence so that images are reconstructed that have substantially no saturation of blood. As will be described in detail below, when a tagged image is subtracted from a control image the result is a "difference" image indicative of the blood flowing into the imaging volume. It is a teaching of the present invention that such difference images are produced that are selectively sensitive to a wide range of blood flow velocities and are further indicative of blood flow changes in small, localized regions within a subject.

Referring now to FIG. 5A, another embodiment of a tagging saturation module includes a first 45 degree RF pulse 360 and a second 45 degree RF pulse 362 that are each played out in the presence of a slice-selective gradient 364. Similar to the tagging saturation module described above, after the second RF pulse 362, any remaining transverse magnetization is dephased using a spoiler gradient 366. As illustrated, the spoiler gradient pulses 366 are placed on all three axes; however, in the alternative they can be applied on only one or two of the axes.

Referring particularly to FIG. 5B, another embodiment of a control saturation module includes first 45 degree RF pulse 360 and a second 45 degree RF pulse 361 that are each played out in the presence of a slice-selective gradient 364. In this control saturation module, the second 45 degree RF pulse 361 has an equal but opposite amplitude of the first 45 degree RF pulse 360. This results in an effective tipping of the transverse magnetization produced by the first 45 degree RF pulse 360 back along the longitudinal axis. Therefore, similar to the control module of FIG. 4B, this control saturation module produces substantially zero transverse magnetization.

Figure 6:
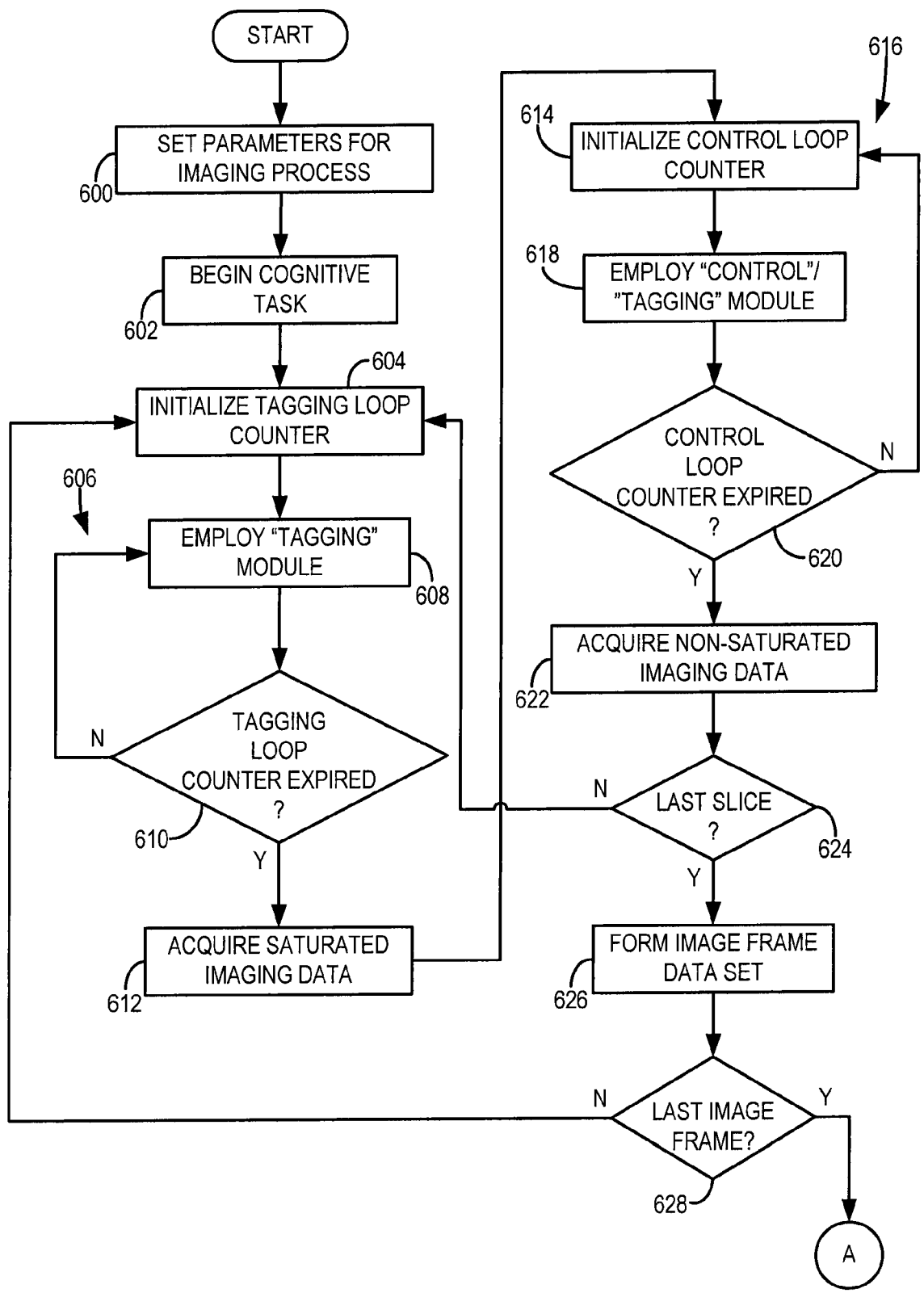
FIG. 6 is a flowchart setting forth the steps of a technique for utilizing the pulse sequence of FIG. 3 in accordance with the present invention.

Referring now to FIG. 6, the steps performed to practice the imaging method in accordance with the present invention start with an operator entering the parameters for the imaging session at process block 600. This includes, for example, the parameters for the above-described saturation module 300, such as the location of the saturation slice and the number of loops in the tagging saturation module ("tagging module") and control saturation module ("control module"), as well as the parameters of the spin-echo sequence and EPI readout 316, such as the location and size of the imaging volume. Additionally, the parameters entered by the operator may include the parameters for the cognitive task to be performed by the subject at process block 602 during the imaging process. Specifically, during the imaging sequence a cognitive task is periodically performed by the subject. The cognitive task may be a motor task, a visual task, or any other suitable task that involves use of those parts of the brain being examined.

Thereafter, a counter is initialized at process block 604 that, as will be described, determines the number of loops in the tagging module loop 606 as selected in process block 600 when selecting the initial parameters for the imaging session. Once the tagging loop counter is initialized at process block 604, the tagging module of the pulse sequence is performed. As described above with reference to FIG. 4A, in one embodiment the tagging module includes the application of a single 90 degree RF pulse 350 in the presence of a slice-selective gradient 352, followed by the application of spoiler gradients 354 along each of the x-, y-, and z-axes. In accordance with one embodiment, every other TR, the slice select and spoiling gradients are played out without the tagging RF pulse, similar to the control module of FIG. 4B. Performing the control module every other TR in lieu of the tagging module during the tagging portion of the pulse sequence is an optional variation that is alternatively employed depending on the desired application. This interleaved tagging and control scheme allows for the reconstruction of temporally adjacent "tag" and "control" images. By utilizing interleaved tagging and control modules, tag and control images are reconstructed from data that has been acquired close together in time. As a result, errors from signal drift over time in the MRI system, subject motion during an examination, or other signal changes that may occur slowly over time are mitigated when producing difference images between the tag and control images, as will be described in detail below.

In an alternative embodiment of the tagging module described above with reference to FIG. 5A, the tagging module includes the application of a first and second 45 degree RF pulse 360 and 362, each in the presence of a slice-selective gradient 364 and similarly followed by the application of spoiler gradients 366 along each of the x-, y-, and z-axes.

Following thereafter, the tagging loop counter is reviewed at decision block 610. As long as the tagging loop counter has not expired, the process continues by reiterating the tagging module loop 606. When employing the tagging module of FIG. 4A, the tagging loop 606 preferably repeats 30 times; however, when employing the tagging module of FIG. 5A, the tagging loop 606 preferably repeats 60 times.

The tagging module loop 606 is designed to destroy the MR signal in a very thin slice in the middle of a larger imaging volume. Spins located in the saturated slice flow or diffuse out of the slice and are replaced by new inflowing spins which, in turn, become saturated. By looping the tagging process, the MR signal within a certain slice, and for a prescribed repetition time, is repeatedly destroyed, or suppressed. In this situation, signal from static, non-moving tissues is destroyed only at the thin slice; however, signal from flowing blood is destroyed as it moves through the saturation slice and into the surrounding imaging volume, resulting in a substantial amount of signal from flowing blood being destroyed. As a result, the MR signal within the thin saturation slice will be suppressed. Stationary spins will have their signals substantially completely suppressed while moving spins will be mostly suppressed within the slice. Those moving spins will flow into the surrounding imaging volume and appear suppressed in the resulting image that is reconstructed from data acquired before they can recover (i.e., acquired within the $T_1$ period).

After the tagging period, the magnetization will be suppressed in a volume both within and outside the directly saturated slice. The saturated magnetization corresponds to all the spins that have flowed through the saturation slice during the tagging period. Once the tagging loop has expired, the SE-EPI portion of the pulse sequence is applied at process block 612 so that saturated image data is acquired. A single shot SE-EPI pulse sequence acquires k-space data from which a complete 2D slice image can be reconstructed. Performing fMRI requires acquisition of a 3D volume that is typically done by acquiring 20 or so contiguously spaced 2D slices. To this end, as will be described, a plurality of slices with destroyed magnetization is acquired.

Thereafter, a control loop counter is initialized at process block 614 and a control loop 616 is entered. In the control loop 616, either a control or tagging module is employed prior to data acquisition, as indicated at process block 618 and described in more detail below. When the tagging module of FIG. 4A is employed in the tagging loop 606, the control module of FIG. 4B is preferably utilized in the control loop 616 at process block 618. Similarly, when employing the tagging module of FIG. 5A, the control module of FIG. 5B is preferably utilized. Following thereafter, the control loop counter is reviewed at decision block 620. As long as the control loop counter has not expired, the process continues by reiterating the control module loop 616. Preferably, the control loop 616 is reiterated the same number of times that the tagging loop 606 is reiterated. In this way, the magnetization transfer effects between the tagging and control acquisitions are matched. For example, if the tagging loop 606 includes 60 repetitions of the tagging module of FIG. 5A, then the control loop 616 will similarly include 60 repetitions of either the control or tagging module. However, it is often preferable in the control loop 616 to saturate at least some of the spins. In this way, in at least one of the repetitions of the control loop 616 a tagging module is performed at step 618 instead of a control module. For example, if the tagging module of FIG. 5A is employed in the tagging loop 606, then the last ten repetitions of the control loop will employ the tagging module of FIG. 5A instead of the control module. In this way, the spins in the static tissues of the imaging slice will be saturated.

The SE-EPI portion of the pulse sequence is again applied at process block 622; however, this time "non-saturated" image data is acquired. Non-saturated image data refers to image data acquired with little or no application of the tagging module, causing destroyed magnetization to flow into the imaging slice. To acquire the necessary plurality of slices, a check is made at decision block 624 to determine whether the last slice needed for a given image frame has be acquired. If not, the process reiterates by re-initializing the tagging loop counter at process block 604. Once the last slice has been acquired, the acquired data is stored as a data set for the given image frame, as indicated at process block 626, which will be subsequently used to reconstruct an image frame of an overall fMRI sequence of images.

A check is then made at decision block 628 to determine whether the previous image frame data set covered the last prescribed frame. If not, the process reiterates to apply the above described process to acquire the next image frame data set. In particular, the process reiterates back to initialize the tagging loop counter at process block 604. Once the last image frame has been acquired, data acquisition is complete and data reconstruction and processing can begin.

Figure 7:
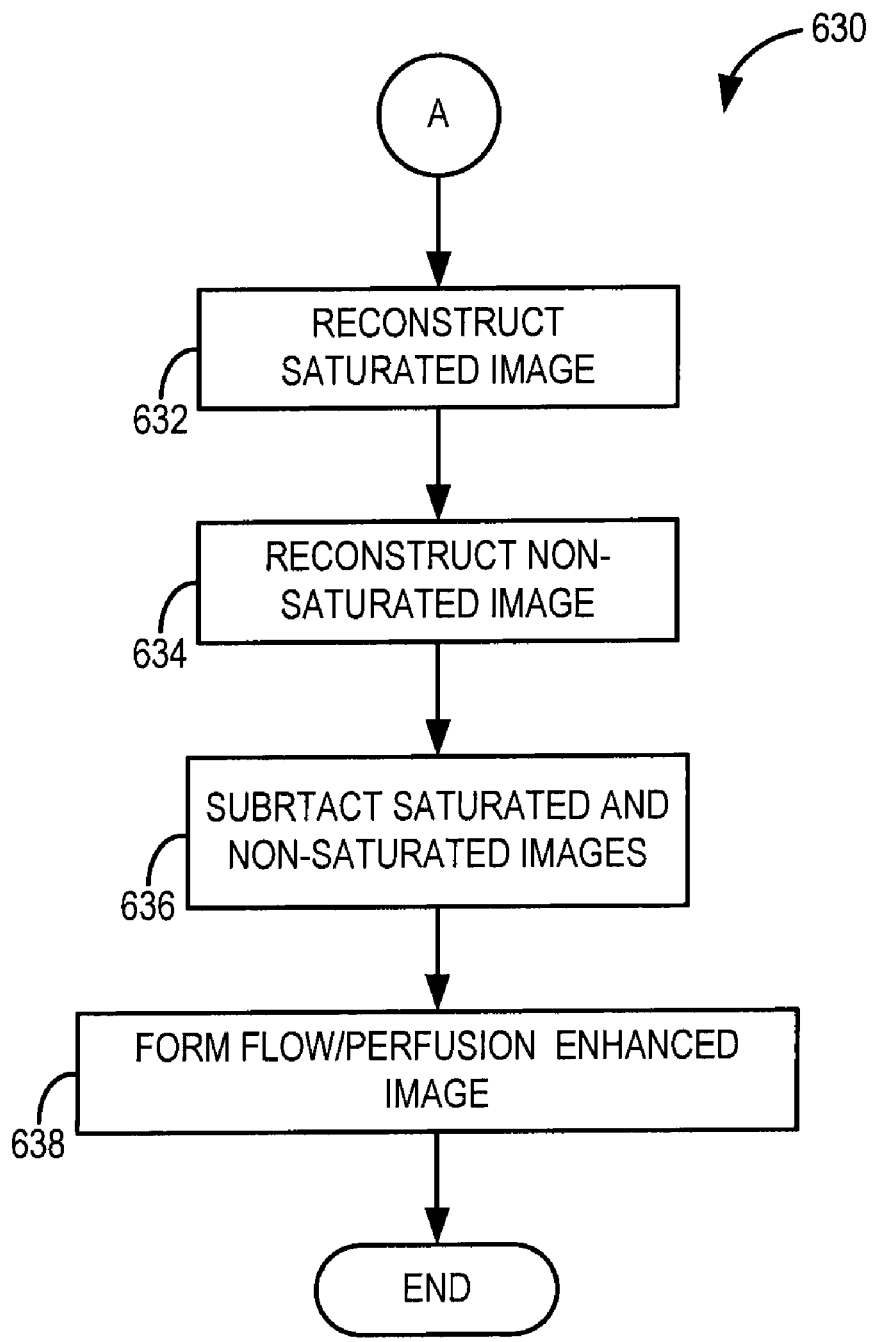
FIG. 7 is a flowchart setting for the steps for processing the data acquired using the steps set forth in FIG. 6.

Referring now to FIG. 7, the imaging data acquired according to the process described with respect to FIG. 6 yields two image data sets for each image frame that are processed using a data processing method 630. One image data set includes k-space data that was acquired while flowing spins were saturated and the other k-space imaging data set was acquired when the signals in flowing spins have recovered. Accordingly, a saturated image is reconstructed at process block 632 from the saturated imaging data sets and a non-saturated image is reconstructed at process block 634 from the non-saturated image data sets using a conventional image reconstruction method. The saturated and non-saturated images are then subtracted on a pixel-by-pixel basis at process block 636 to yield a flow or perfusion enhanced difference image at process block 638. This image depicts, through the brightness of each pixel, the velocity of flowing spins in the imaging volume. Accordingly, the velocity of the flowing blood through a target region of the brain can be readily identified at process block 638. By performing this imaging method in a time series during the performance of a functional task, such as the one initiated at process block 602 and continued through the process, the signal intensity values of the resulting image directly relate to flow and functionally-induced changes in the blood flow through the thin saturation slice, and into the imaging volume.

The method is sensitive to the perpendicular component of the velocity of flow. Non-perpendicular and tortuous flow pathways exist in the brain and will affect the enhancement and range of velocity sensitivity of the method. This results in lower signal enhancements and signal-to-noise ratios than those theoretically predicted. However, the functional imaging signal will be preserved as long as orientations do not change between task and rest conditions. In accordance with the present invention, "signal enhancement" refers to a signal gain attained by measuring all of the spins that are present in or that pass through a small region over a period of time. This is compared to a standard imaging technique that only reports the spins that are present in the small region at a given time. As will be described, by summing all spins that pass through a region, significant gains in signal-to-noise ratio can be achieved.

As described above, the tagging module is used to store information about slow flowing blood in small vessels, in an analogous manner to the way that magnetization transfer contrast stores information about the presence of macromolecules. To this end, signal enhancement, $E(x, y, t)$, is defined as the ratio of the signal intensity difference between the enhanced image and the un-enhanced image to the signal intensity of the un-enhanced image. The un-enhanced image is an image of the thin saturation slice with a conventional MR acquisition.

The ratio of the signal intensity difference between the enhanced image and the un-enhanced image, which can be obtained by conventional MR, to the signal intensity of the un-enhanced image is termed the signal enhancement, denoted $E(x, y, t)$, is given by:

$$E(x, y, t) = \frac{1}{2a_{|z|>a}} \int \left[ \frac{1 - M(x, y, z, t)}{M_0(x, y, z)} \right] dz \quad (2)$$

$$= \frac{1}{2a_{|z|>a}} \int m(x, y, z, t) dz;$$

where 2a, again, is the thickness of the directly saturated region, t is the total time of the tagging module, $M(x, y, z, t)$ is the z-component of the magnetization, $M_0(x, y, z)$ is the thermal equilibrium magnetization, and:

$$m(x, y, z, t) = \frac{(M_0 - M)}{M_0}$$

is the proportion of the missing magnetization due to saturation. In the presence of flow, the time dependence of the magnetization, neglecting relaxation effects, is governed by the advection-diffusion equation:

$$\frac{\partial m}{\partial t} + v \frac{\partial m}{\partial z} = D \frac{\partial^2 m}{\partial z^2}; \quad (3)$$

where v is the fluid velocity in the z-direction and D is the diffusion coefficient. Assuming an ideal case in which the flow is oriented perpendicular to the tagging slice and the following initial and boundary conditions:

$$m|_{|z|>a} = 0 \text{ for } t \leq 0; \quad (4)$$

$$m|_{|z|\leq a} = 1 \text{ for all } t; \quad (5)$$

$$m|_{|z|\to\infty} = 0 \text{ for } t = 0; \text{ and} \quad (6)$$

the following analytical solution to equation (3) is found when applying the boundary conditions set forth in equations (4)-(6):

$$m(x, y, z, t) = 0.5 \cdot \text{erfc}\left(\frac{z - vt}{2\sqrt{Dt}}\right) + 0.5 \cdot e^{\left(\frac{vz}{D}\right)} \cdot \text{erfc}\left(\frac{z + vt}{2\sqrt{Dt}}\right), \quad (7)$$

where erfc( . . . ) is the complementary error function.

Equation (3) is an accurate description of the magnetization evolution if the duration of the RF pulse 350 of the tagging module is much shorter than the effective $T_1$ in the presence of flow. If this condition is not satisfied, $T_1$ effects must be accounted for by including a relaxation term in the advection-diffusion equation.

Using the above presented parameters, the signal enhancement for a range of velocities can be calculated. To calculate the enhancement, E, from the measured images acquired using the above-mentioned pulse sequence, enhancement is defined as follows:

$$m_0 - m_N = (1+E)m_\delta; \quad (9)$$

where $m_0$ is the thermal equilibrium magnetization image without saturation, $m_N$ is an image acquired with N repetitions of the tagging module, and $m_\delta$ is the signal contribution from the thin saturation slice without enhancement. As described above, in one embodiment of the present invention, N=30, while in another embodiment, N=60.

From equation (9) above, the enhancement can be rewritten as:

$$E = \frac{(m_0 - m_\delta) - m_N}{m_\delta}. \quad (10)$$

As an example, assuming a blood volume fraction of 0.05, a blood flow velocity of v=15 mm/s, and an average diffusion coefficient D=3 μm²/ms with a 330 ms tagging time and a 1 cm thick imaging volume, the enhancement, E, reaches a plateau value of 0.65 when the flow rate is large enough to escape the larger imaging slice during the experimental time. Performing a functional experiment using these example values result in a 13% increase in the signal.

However, $m_\delta$ is, preferably, not imaged directly. Instead images are, for example, taken with one and 30 repetitions of the tagging module. However, in the alternative, images are taken with 10 and 60 repetitions of the tagging module. Therefore, the image with one repetition of the tagging module, $m_1$, can be expressed as:

$$m_1 = m_0 - m_\delta; \quad (11)$$

assuming the enhancement is negligible during one saturation pulse. If the value of the enhancement, E, is desired, it can be calculated from three or more acquired images, including at least one with no saturation, $m_0$, one with one repetition of the tagging module, $m_1$, and one with N repeated tagging modules, $m_N$. Combining equations (10) and (11) yields:

$$E = \frac{m_1 - m_N}{m_\delta} = \frac{m_1 - m_N}{m_0 - m_1}. \quad (12)$$

More generally, instead of acquiring an image with only one repetition of the tagging module, $m_1$, an image, $m_P$, can be acquired with P repetitions of the tagging module. When the above-described method is applied to MRI flow imaging of the brain, the limiting factor is the small partial volume fraction of blood vessels in the brain. As the overall voxel size from this method is reduced, the partial volume fraction increases in regions having larger vessels. To yield desirable results, generally, the slice dimension is small, for example 0.4-2.0 mm, with the other dimensions of the imaging process at the same level as standard BOLD acquisitions (e.g., around 3.5 mm).

However, due to the use of a thin saturation slice, the method is very sensitive to subject motion. Subject motion mixed with the "hole-burning" mechanism of the method can result in large increases in signal as the static tissue gets saturated over a larger spatial extent during tagging. In operation some data sets may need to be discarded due to excessive motion.

Additionally, similar to ASL methods, the present invention may be susceptible to reduced temporal resolution results from the need to acquire saturation and control images to form a flow image. For ASL, several methods have been developed to overcome this temporal resolution disadvantage, including running separate experiments with tagging and control acquisitions or interleaving the control acquisition and the transit time of the label. It is contemplated that the above-described system and method may benefit from using separate saturation and control measurements.

The invention provides a system and method to estimate blood velocity from the localized imaging voxels. However, the velocity estimates differ from those of ASL experiments. Specifically, whereas ASL measures bulk delivery of blood to the imaging voxels in ml/100 g tissue/min, the present invention measures blood flow in cm/s perpendicular to the imaging slice.

The above-described method utilizes signal enhancements due to flow through a thin saturation, or tagging slice. The method offers a way to acquire a localized measure of flow with directional and velocity sensitivity. That is, the method results in signal enhancements related to the velocity and changes in velocity of blood flow through a thin saturation slice that lies within a larger imaging volume. The method can allow for the study of arteriole flow, the level of control of flow in the brain. In order to visualize flow in arterioles, the method has to be sensitive to velocities of approximately 2 cm/s. The above-described method peaks in sensitivity to changes in flow at the 1.5 cm/s range for perpendicularly oriented flow, which is the desired range of sensitivity for a variety of incident angles.

In addition to calculating blood flow velocity, volumetric blood flow rate can additionally be determined. Similar to the method for determining blood flow velocity detailed in equation (12), the volumetric blood flow rate, Q, is calculated by:

$$Q = \lambda \cdot \left(\frac{m_P - m_N}{\frac{(m_0 - m_P)}{V_{tag}}}\right) \cdot \left(\frac{1}{\Delta t \cdot 60}\right), \quad (13)$$

Where $\lambda$ is the brain-blood partition coefficient of water and has a value of 0.9, $V_{tag}$ is the volume of a voxel in the tagged slice, and $\Delta t$ is the duration of the tagging period (i.e., the sum total of time during which the tagging modules are performed) in seconds. Substituting equation (12) into equation (13) yields a calculation of the volumetric blood flow rate as it depends on the measured signal enhancement, E:

$$Q = \frac{\lambda E V_{tag}}{\Delta t \cdot 60}. \quad (14)$$

Figure 8:
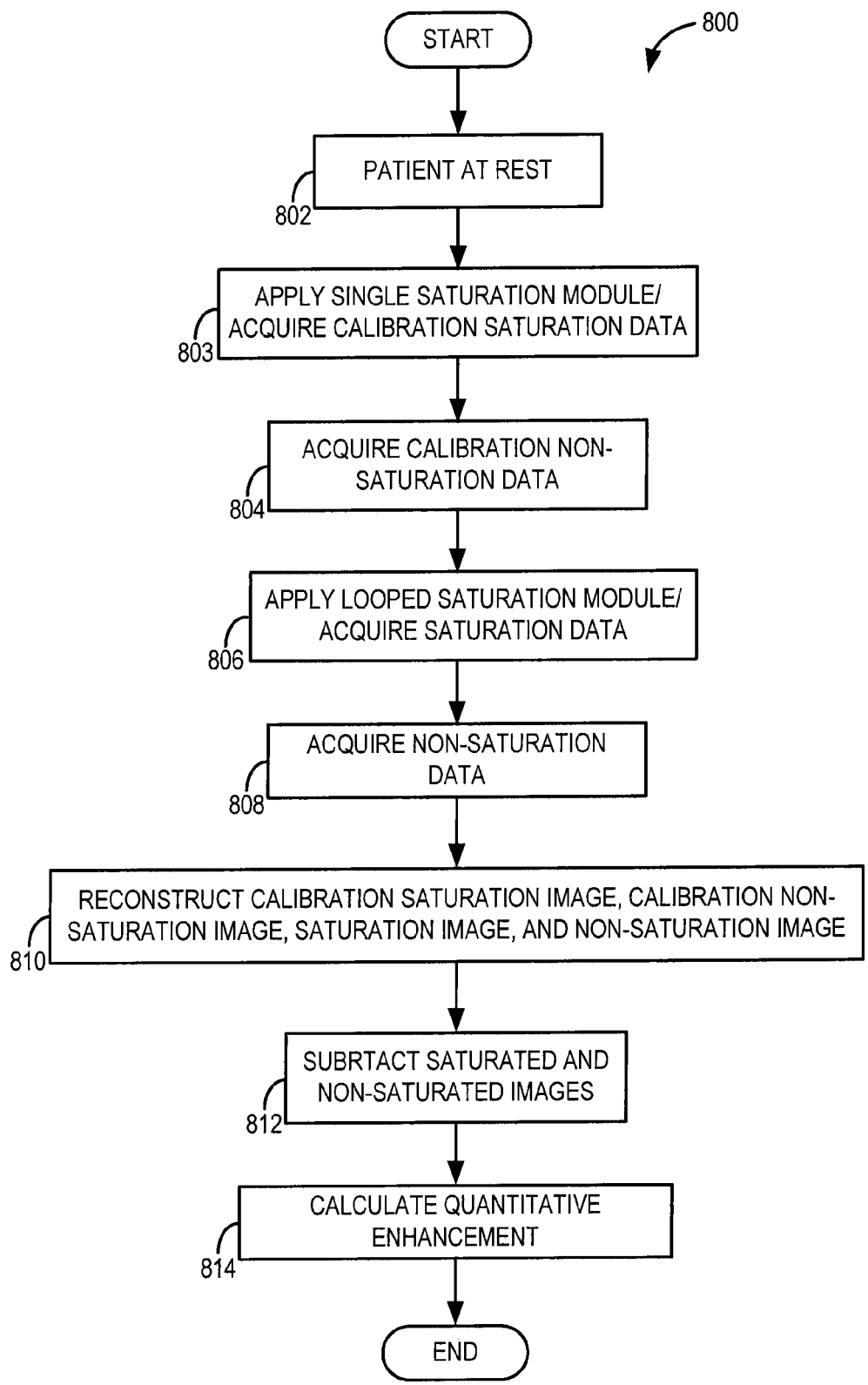
FIG. 8 is a flow chart setting forth the steps of a technique for utilizing the pulse sequence of FIG. 3 in accordance with the present invention without the use of a cognitive task.

In addition to the functional imaging mode described above where a cognitive task is presented to the subject and tag and control images are acquired, averaged, and subtracted, the present invention may be used in a mode that does not utilize a cognitive task Referring now to FIG. 8, the present invention may operate according to another method to quantitatively measure velocity without a cognitive task. In this case, unlike the process described above, the process starts with the subject at rest 802. A calibration acquisition is acquired that includes a single saturation acquisition to acquire calibration saturation data at process block 803 followed by the acquisition of calibration non-saturation data at process block 804. Thereafter, "tagged", or saturated, data and control, or non-saturated, data are acquired at process blocks 806 and 808, respectively, in a manner similar to that described with respect to FIGS. 6 and 7. Four images are reconstructed at process block 810 from the acquired data. Specifically, a calibration saturation image, a calibration non-saturation image, a saturation image, and a non-saturation image are reconstructed. As also similar to that described with respect to FIGS. 6 and 7, the saturation and non-saturation images are averaged and subtracted at process block 812. From the four images, the quantitative enhancement (and hence velocity) is calculated at process block 814 using the above described method, specifically, equation (12). Additionally, at this point the volumetric blood flow rate can be calculated as set forth in equation (13).

The present invention has been described in terms of one or more preferred embodiments, and it should be appreciated that many equivalents, alternatives, variations, and modifications, aside from those expressly stated, are possible and within the scope of the invention. For example, data acquisition sequences other than spin-echo echo planar imaging may be employed to acquire image data as it should be appreciated by those skilled in the art that many various imaging sequences can be employed to acquire fMRI image data and other functional MR image data.

The invention claimed is:

1. A method for producing, with a magnetic resonance imaging (MRI) system, an image indicative of an imaging volume within a subject, the steps comprising:
   a) acquiring from the imaging volume, a saturated image data set that is sensitized to at least one blood flow velocity by directing the MRI system to perform a pulse sequence that includes:
      i) applying a tagging saturation radio frequency ("RF") pulse to a localized region within the imaging volume;
      ii) repeating step a)i) a plurality of times so that magnetization of blood flowing into the imaging volume at substantially only the at least one selected blood flow velocity from the localized region is substantially saturated;
      iii) acquiring the saturated image data set following step a)ii);
   b) acquiring from the imaging volume, a non-saturated image data set by directing the MRI system to perform a pulse sequence that acquires the non-saturated image data set such that magnetization of blood flowing into the imaging volume is substantially not saturated;
   c) reconstructing a saturated image from the saturated image data set;
   d) reconstructing a non-saturated image from the non-saturated image data set; and
   e) producing, by subtracting the saturated image from the non-saturated image, a difference image indicative of blood flow in the imaging volume within the subject that occurs at the at least one blood flow velocity.

2. The method as recited in claim 1 further comprising providing a functional task for the subject to perform during steps a)-b) so that the difference image is indicative of functionally-induced blood flow in the imaging volume resulting from the performance of the functional task.

3. The method as recited in claim 1 in which step a)ii) includes adding a delay time between repetitions of step a)i) so that the saturated image data set acquired in step a)iii) is sensitized to the at least one blood flow velocity.

4. The method as recited in claim 1 in which step a)iii) includes applying flow crusher gradients before the saturated image data set is acquired, and in which step b) includes applying flow crusher gradients before the non-saturated image data set is acquired so that MR signals from blood flowing at velocities above a selected threshold are substantially suppressed in the acquired saturated image data set and non-saturated image data set, respectively.

5. The method as recited in claim 1 further comprising calculating a quantitative blood flow velocity from the difference image.

6. The method as recited in claim 1 further comprising:
   f) repeating step a) to acquire a second saturated image data set from the imaging volume; and
   g) reconstructing a second saturated image from the second saturated image data set.

7. The method as recited in claim 6 further comprising calculating a volumetric blood flow rate using the saturated image reconstructed in step c), the second saturated image reconstructed in step g), and the non-saturated image reconstructed in step d).

8. The method as recited in claim 7 in which the volumetric blood flow rate is calculated on a voxel-by-voxel basis according to:

$$Q = \lambda \cdot \left( \frac{m_P - m_N}{\frac{(m_0 - m_P)}{V_{tag}}} \right) \cdot \left( \frac{1}{\Delta t \cdot 60} \right);$$

wherein:
Q is the volumetric blood flow rate;
$\lambda$ is a brain-blood partition coefficient of water;
$m_P$ is a voxel value of the second saturated image reconstructed in step g);
$m_N$ is a voxel value of the saturated image reconstructed in step c);
$m_0$ is a voxel value of the non-saturated image reconstructed in step d);
$V_{tag}$ is a volume of the localized region to which tagging saturation RF pulses are applied in step a); and
$\Delta t$ is a time during which step a) is performed.

9. A method for imaging an imaging volume within a subject with a magnetic resonance imaging (MRI) system, the steps comprising:
   a) acquiring from the imaging volume, a first saturated image data set by directing the MRI system to perform a pulse sequence that includes applying a tagging saturation radio frequency (RF) pulse to a localized region within the imaging volume before acquiring the first saturated image data set;

b) acquiring from the imaging volume, a first non-saturated image data set by directing the MRI system to perform a pulse sequence that acquires the first non-saturated image data set such that magnetization of blood flowing into the imaging volume is substantially not saturated;
c) acquiring from the imaging volume, a second saturated image data set by directing the MRI system to perform a pulse sequence that includes repeatedly applying a tagging saturation RF pulse to the localized region within the imaging volume so that magnetization of blood flowing into the imaging volume at substantially only the at least one selected blood flow velocity from the localized region is substantially saturated before acquiring the second saturated image data;
d) acquiring from the imaging volume, a second non-saturated image data set by directing the MRI system to perform a pulse sequence that acquires the second non-saturated image data set such that magnetization of blood flowing into the imaging volume is substantially not saturated;
e) reconstructing a calibration saturated image from the first saturated image data set;
f) reconstructing a calibration non-saturated image from the first saturated image data set;
g) reconstructing a saturated image from the second saturated image data set;
h) reconstructing a non-saturated image from the second non-saturated image data set;
i) calculating a quantitative signal enhancement from the calibration saturated image, the calibration non-saturated image, the saturated image, and the non-saturated image.

10. The method as recited in claim 9 in which the acquired second saturated image data set is sensitized by adding a delay time between the repeated applications of the tagging saturation RF pulse in step c).

11. The method as recited in claim 9 further comprising applying flow crusher gradients before the second saturated image data is acquired in step c) and before the second non-saturated image data set is acquired in step d) so that MR signals from blood flowing at velocities above a selected threshold are substantially suppressed in the second saturated image data and the second non-saturated image data set.

12. The method as recited in claim 9 further comprising calculating a quantitative blood flow velocity from the quantitative signal enhancement.

13. The method as recited in claim 9 further comprising calculating a volumetric blood flow rate from the quantitative signal enhancement.

14. The method as recited in claim 13 in which the volumetric blood flow rate is calculated on a voxel-by-voxel basis according to:

$$Q = \frac{\lambda E V_{tag}}{\Delta t \cdot 60};$$

wherein:
Q is the volumetric blood flow rate;
$\lambda$ is a brain-blood partition coefficient of water;
E is the quantitative signal enhancement calculated in step i);
$V_{tag}$ is a volume of the localized region to which tagging saturation RF pulses are applied in steps a) and c); and
$\Delta t$ is a time during which the tagging saturation RF pulses are applied in step c).

* * * * *

UNITED STATES PATENT AND TRADEMARK OFFICE
CERTIFICATE OF CORRECTION

| | | |
|---|---|---|
| PATENT NO. | : 8,121,668 B2 | Page 1 of 1 |
| APPLICATION NO. | : 12/179994 | |
| DATED | : February 21, 2012 | |
| INVENTOR(S) | : Sutton et al. | |

It is certified that error appears in the above-identified patent and that said Letters Patent is hereby corrected as shown below:

Column 16, Claim 2, line 11, "from the performance" should be --from performance--.

Signed and Sealed this
Tenth Day of April, 2012

David J. Kappos
*Director of the United States Patent and Trademark Office*